(12) United States Patent (10) Patent No.: US 8,098,366 B2
Saenger et al. (45) Date of Patent: Jan. 17, 2012

(54) OPTICAL SYSTEM, IN PARTICULAR OF A MICROLITHOGRAPHIC PROJECTION EXPOSURE APPARATUS

(75) Inventors: Ingo Saenger, Heidenheim (DE); Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 12/968,781

(22) Filed: Dec. 15, 2010

(65) Prior Publication Data

US 2011/0149261 A1 Jun. 23, 2011

Related U.S. Application Data

(60) Provisional application No. 61/297,923, filed on Jan. 25, 2010.

(30) Foreign Application Priority Data

Dec. 22, 2009 (DE) .......................... 10 2009 055 184

(51) Int. Cl.
*G03B 27/72* (2006.01)
(52) U.S. Cl. ......................................... 355/71
(58) Field of Classification Search .................. 355/71, 355/67, 53
See application file for complete search history.

(56) References Cited

U.S. PATENT DOCUMENTS
2006/0055909 A1 3/2006 Fiolka et al.

FOREIGN PATENT DOCUMENTS

| EP | 1 621 930 A2 | 2/2006 |
|---|---|---|
| JP | 09-043401 | 2/1997 |
| JP | 2006-041540 | 9/2006 |
| JP | 2007-515768 | 6/2007 |
| JP | 2007-527549 | 9/2007 |
| JP | 2007-258575 | 10/2007 |
| WO | WO 2005/031467 | 4/2005 |
| WO | WO 2005/069081 | 7/2005 |
| WO | WO 2005/069081 A2 | 7/2005 |

OTHER PUBLICATIONS

German Office Action for corresponding DE Appl No. 10 2009 055 184.0-51, dated Sep. 15, 2010, with English translation (4 pages).
Japanese Office Action, with English translation, for corresponding Application No. JP 2010-294811, dated Apr. 27, 2011.

*Primary Examiner* — Peter B Kim
*Assistant Examiner* — Chia-how Michael Liu
(74) *Attorney, Agent, or Firm* — Fish & Richardson P.C.

(57) ABSTRACT

An optical system, in particular of a microlithographic projection exposure apparatus, includes an optical system axis and a polarization-influencing optical arrangement, wherein said arrangement has a polarization-influencing optical element which includes an optically active material having an optical crystal axis and is of a thickness profile which varies in the direction of said optical crystal axis, and a position manipulator for manipulation of the position of said polarization-influencing optical element, wherein the polarization manipulator is adapted to cause rotation of the polarization-influencing optical element about an axis of rotation, wherein said axis of rotation is arranged at an angle of 90°±5° relative to the optical system axis.

15 Claims, 7 Drawing Sheets

OPTICAL SYSTEM, IN PARTICULAR OF A MICROLITHOGRAPHIC PROJECTION EXPOSURE APPARATUS

CROSS REFERENCE TO RELATED APPLICATIONS

This application claims priority of German Patent Application 10 2009 055 184.0 filed on Dec. 22, 2009, as well as U.S. Provisional application 61/297,923 filed on Jan. 25, 2010. The content of these applications is hereby incorporated by reference.

BACKGROUND

Field of the Disclosure

The disclosure concerns an optical system, in particular of a microlithographic projection exposure apparatus. In particular the disclosure concerns an optical system having a polarization-influencing optical arrangement which is suitable for use in an illumination system or a projection objective of a microlithographic projection exposure apparatus and which permits flexible adjustment of different polarization distributions including a mixed tangential-radial polarization distribution.

Microlithography is used for the production of microstructured components such as for example integrated circuits or LCDs. The microlithography process is carried out in what is referred to as a projection exposure apparatus having an illumination system and a projection objective. The image of a mask (also referred to as a reticle) illuminated using the illumination system is in that case projected using the projection objective on to a substrate (for example a silicon wafer) which is coated with a light-sensitive layer (photoresist) and arranged in the image plane of the projection objective to transfer the mask structure on to the light-sensitive coating on the substrate.

Both in the illumination system and also in the projection objective it is known to set in particular a tangential polarization distribution for high-contrast imaging. The expression 'tangential polarization' (or 'TE polarization') is used to denote a polarization distribution with which the planes of vibration of the electric field strength vectors of the individual linearly polarized light beams are oriented approximately perpendicularly to the radius directed towards the optical system axis. In contrast the expression 'radial polarization' (or 'TM polarization') is used to denote a polarization distribution with which the planes of vibration of the electric field strength vectors of the individual linearly polarized light beams are oriented approximately radially with respect to the optical system axis.

WO 2005/069081 A2 discloses inter alia a polarization-influencing optical element comprising an optically active crystal and being of a thickness profile which varies in the direction of the optical crystal axis. In that case inter alia the element 200 shown in FIG. 2a of the present application is disclosed for conversion of a linear polarization distribution with a constant preferred polarization direction into a tangential polarization distribution. That element 200 is of a thickness profile which as shown in FIG. 2b is dependent only on an azimuth angle θ related to a reference axis RA, wherein the reference axis RA intersects the element axis EA in perpendicular relationship. In that case the thickness of the element 200 remains constant in the radial direction. For reasons of production engineering, at the center of the element 200, that is to say in the region of small radii, there is a hole 11 in which the polarization remains unchanged.

In addition there is also a need for setting further polarization distributions which vary over the pupil of the illumination system.

It is known inter alia from US 2006/0055909 A1 to use for example a first and a second polarization manipulator in an illumination system of a microlithographic projection exposure apparatus for avoiding polarization-induced birefringence, wherein optical elements arranged between those polarization manipulators are illuminated through the first polarization manipulator with light of a polarization direction varying in respect of time in order to switch to and fro between for example orthogonal polarization states and wherein a polarization direction which is constant in respect of time is set by the second polarization manipulator.

SUMMARY

In certain aspects, embodiments of the invention provide an optical system, in particular of a microlithographic projection exposure apparatus, which permits flexible setting of different polarization distributions including a mixed tangential-radial polarization distribution.

In general, in one aspect, the invention features an optical system, in particular of a microlithographic projection exposure apparatus, that includes an optical system axis and a polarization-influencing optical arrangement, the optical system having:

at least one polarization-influencing optical element which includes an optically active material having an optical crystal axis and is of a thickness profile which varies in the direction of said optical crystal axis; and a position manipulator for manipulation of the position of said polarization-influencing optical element, wherein the polarization manipulator is adapted to cause rotation of the polarization-influencing optical element about an axis of rotation, wherein said axis of rotation is arranged at an angle of 90°±5° relative to the optical system axis.

The rotatability afforded by the polarization-influencing optical element about an axis of rotation arranged substantially perpendicularly to the optical system axis provides that, starting from the respectively same polarization distribution (for example a linear polarization distribution with a preferred polarization direction which is constant over the light beam cross-section), it is possible to change flexibly between different starting polarization distributions depending on the respective rotary position of the polarization-influencing optical element.

In that respect the flexible adjustment of different illumination settings, which is possible in that way in a projection exposure apparatus, can be effected without using additional optical components (such as for example λ/2 plates), which leads to a significant reduction in structural expenditure and the costs for example for a lithography process. A further advantage is that it can be possible to avoid a transmission loss which is typically involved in the use of additional optical components.

In some embodiments, the polarization-influencing optical element is adapted in at least one position of the polarization-influencing optical element to convert a linear polarization distribution with a preferred polarization direction that is constant over the light beam cross-section of a light beam passing through the polarization-influencing optical element into an at least approximately tangential polarization distribution. In that case it may be possible to change between the production of a tangential starting polarization distribution and the production of a mixed tangential-radial polarization distribution using the polarization-influencing optical arrangement or depending on the respective rotary position of the polarization-influencing optical element.

Here and hereinafter the expression a 'mixed tangential-radial polarization distribution' (which can also be referred to as TE/TM polarization distribution or TM/TE polarization distribution) is used to denote a polarization distribution having a continuous transition between a tangential and a radial polarization distribution. In other words, at the transition between locations in the pupil in which the planes of vibration of the electric field strength vectors of the individual linearly polarized light beams are oriented approximately perpendicularly with respect to the radius directed towards the optical system axis, and locations in which the planes of vibration of the electric field strength vectors of the individual linearly polarized light beams are oriented approximately parallel with respect to the radius directed towards the optical system axis, such a polarization distribution has locations in which the planes of vibration are between those two 'extreme' positions and change continuously over the pupil from the tangential to the radial orientation.

In accordance with a further approach the disclosure concerns an optical system, in particular of a microlithographic projection exposure apparatus, comprising a polarization-influencing optical element comprising an optically active material having an optical crystal axis and of a thickness profile varying in the direction of said optical crystal axis;

wherein the polarization-influencing optical element is so arranged in the optical system that it converts a linear polarization distribution with a preferred polarization direction that is constant over the light beam cross-section of a light beam passing through the polarization-influencing optical element into a mixed tangential-radial polarization distribution.

In some embodiments, the optically active material is crystalline quartz.

In certain embodiments, the polarization-influencing optical element has an element axis and the thickness profile is dependent only on the azimuth angle, wherein the azimuth angle is related to a reference axis which is perpendicular to the element axis and intersects the element axis.

In some embodiments, the optical system further has a 90° rotator. That can make it possible, in place of the above-mentioned (TE/TM and TM/TE) polarization distribution, to produce a polarization distribution in which once again there is a continuous transition between a tangential and a radial polarization distribution, but as a consequence of the rotation of the preferred polarization direction, introduced by the 90° rotator, with a tangentially extending preferred polarization direction at the positions where there had been radial polarization in the foregoing example, and vice-versa.

The disclosure further concerns a microlithographic projection exposure apparatus and a process for the microlithographic production of microstructured components.

Other embodiments are in the claims.

DETAILED DESCRIPTION

Figure 1:
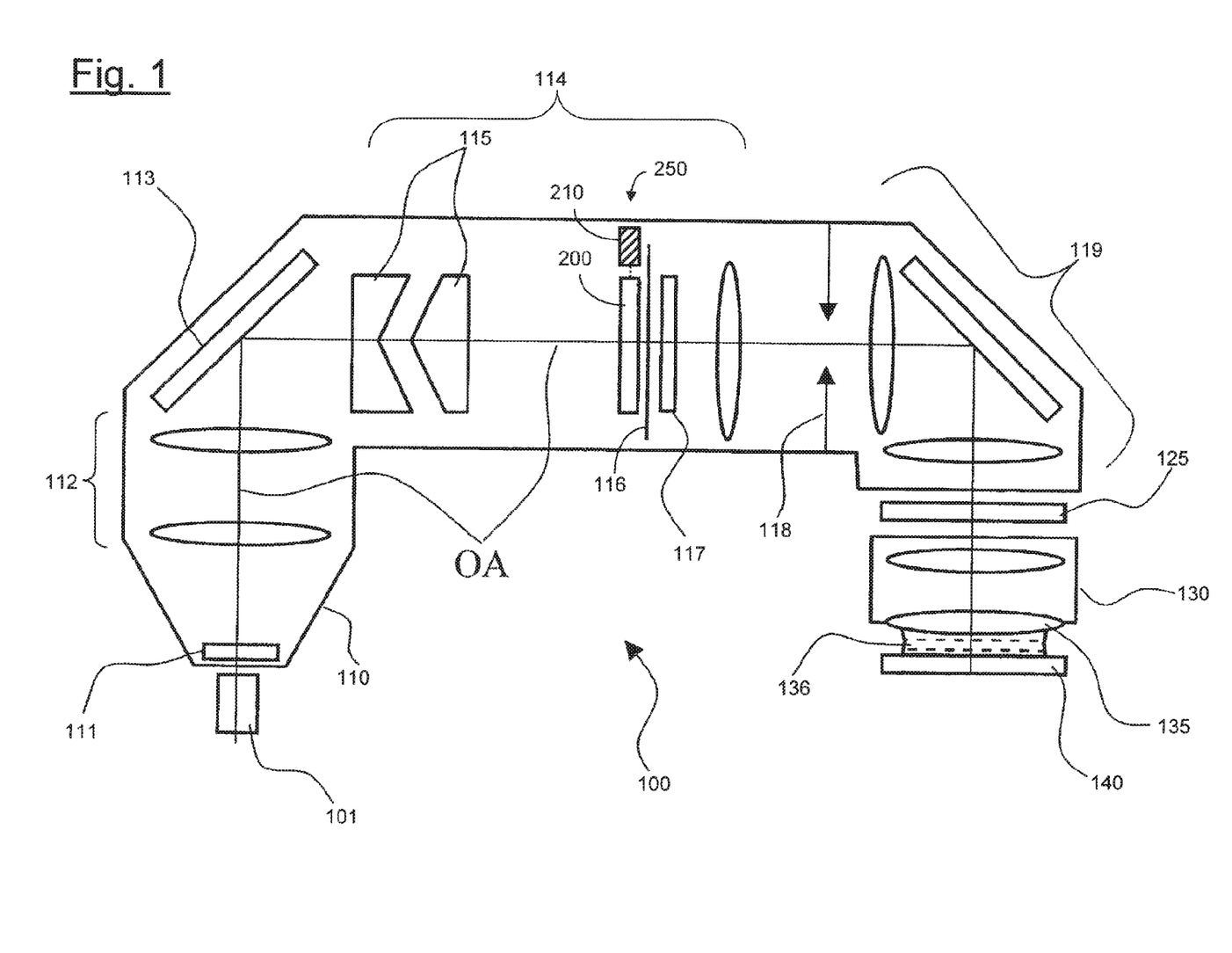
FIG. 1 shows a diagrammatic view to illustrate the structure of a microlithographic projection exposure apparatus with an embodiment of a polarization-influencing optical arrangement.

FIG. 1 shows a diagrammatic view of a microlithographic projection exposure apparatus 100 having a light source unit 101, an illumination system 110, a mask 125 having structures to be imaged, a projection objective 130 and a substrate 140 to be exposed. The light source unit 101 includes as the light source a DUV or VUV laser, for example an ArF laser for 193 nm, an F2 laser for 157 nm, an Ar2 laser for 126 nm or an Ne2 laser for 109 nm, and a beam forming optical system which produces a parallel pencil of light. The rays of the pencil of light have a linear polarization distribution, wherein the planes of vibration of the electric field vector of the individual light rays extend in a unitary direction.

The parallel pencil of light is incident on a divergence-increasing optical element 111. The divergence-increasing optical element 111 can be for example a raster plate of diffractive or refractive raster elements. Each raster element produces a pencil of rays, the angle distribution of which is determined by the extent and focal length of the raster element. The raster plate is disposed in the object plane of a subsequent objective 112 or in the proximity thereof. The objective 112 is a zoom objective which produces a parallel pencil of light of variable diameter. The parallel pencil of light is directed through a deflection mirror 113 on to an optical unit 114 which includes an axicon 115. Different illumination configurations are produced by the zoom objective 112 in conjunction with the axicon 115 in a pupil plane 116 depending on the respective zoom position and position of the axikon elements.

Figure 2A:
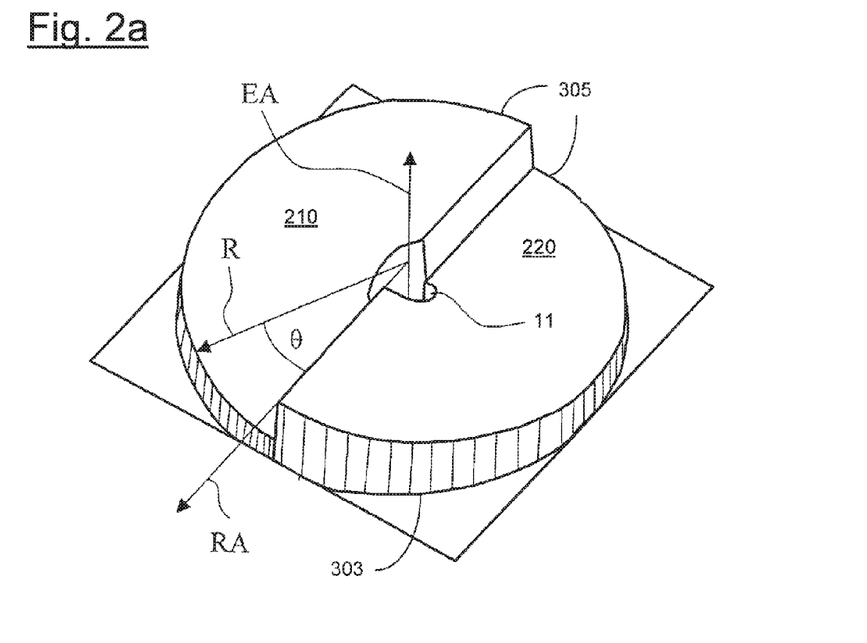
FIGS. 2a-b show a diagrammatic perspective view (FIG. 2a) and a thickness profile (FIG. 2b) of an embodiment of a polarization-influencing optical element present in the polarization-influencing optical arrangement of FIG. 1.
Figure 2B:
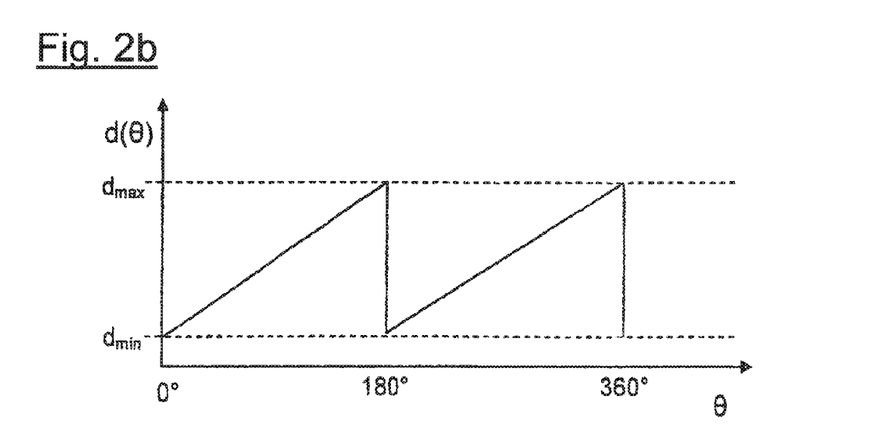

Disposed in the pupil plane 116 or in the immediate proximity thereof is a polarization-influencing optical element 200 as is shown for example in FIG. 2a. Disposed after the polarization-influencing optical element 200 in the light propagation direction is a compensation plate 117, the thickness profile of which is such as to compensate for angle deviations in respect of radiation passing therethrough, caused by the polarization-influencing optical element 200. The optical unit 114 is followed by a reticle masking system (REMA) 118 which is imaged by a REMA objective 119 on to the structure-bearing mask (reticle) 125 and thereby delimits the illuminated region on the reticle 125. The structure-bearing mask 125 is imaged with the projection objective 130 on to the light-sensitive substrate 140. An immersion liquid 136 with a refractive index differing from air is disposed between a last optical element 135 of the projection objective 130 and the light-sensitive substrate 140.

FIG. 2a is a perspective view showing a polarization-influencing optical element 200 as a component part of a polarization-influencing optical arrangement in accordance with an embodiment of the disclosure.

The polarization-influencing optical element 200 is made from an optically active material, such as quartz, and is suited in particular for producing a tangential polarization distribution, and is of a cylindrical shape with a base surface 303 and a surface 305 opposite thereto. The base surface 303 is in the form of a circular flat surface. The element axis EA extends through the center of the circle perpendicularly to the flat surface. The opposite surface 305 is of a configuration in relation to the element axis EA in accordance with a predetermined thickness profile. The optical crystal axis (also referred to as the "optic axis") of the optically active crystal is oriented parallel to the element axis EA. Extending parallel to the element axis EA in the plane of the base surface is the reference axis RA which intersects the element axis and serves as a reference axis for the azimuth angle θ.

In the embodiment shown in FIG. 2 the polarization-influencing optical element 200 is of a constant thickness along a radius R which is perpendicular to the element axis EA and forms an angle θ with the reference axis RA. The thickness configuration shown in FIG. 2b is thus dependent only on the azimuth angle θ.

In the embodiment in FIGS. 2a and 2b, an azimuthal section d (r=const, θ) through the thickness profile d (r, θ) for an azimuth angle 10°<θ<170° (in particular 0°<θ<180°) and for an azimuth angle 190°<θ<350° (in particular 180°<θ<360°) and for a constant spacing r from the element axis, is a linear function of the azimuth angle θ, wherein said linear function has at least approximately a gradient $$|m| = \frac{180°}{\alpha \pi r},$$

wherein α is the specific rotational capability of the optically active crystal.

Disposed at the center of the polarization-influencing optical element 200, for reasons of process engineering, there is a central bore 11. In this case the diameter of that bore is typically about 10-15% of the overall diameter of the polarization-influencing optical element 200, wherein that overall diameter is typically in the range of between 100 mm and 150 mm.

Figure 2C:
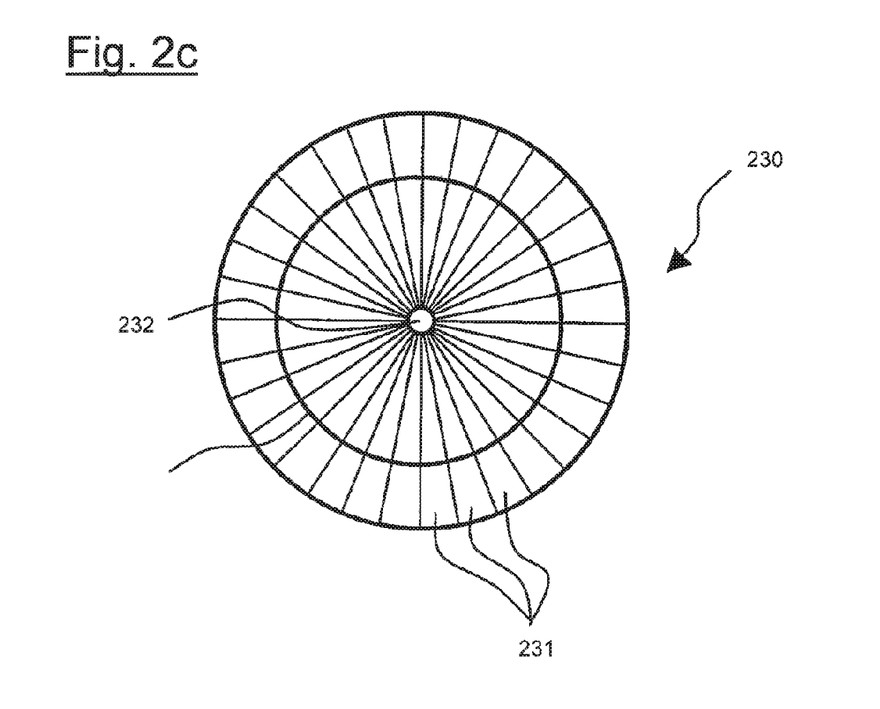
FIG. 2c shows a diagrammatic plan view of an embodiment of a polarization-influencing optical element as a component part of the polarization-influencing optical arrangement in accordance with a further embodiment.
Figure 2D:
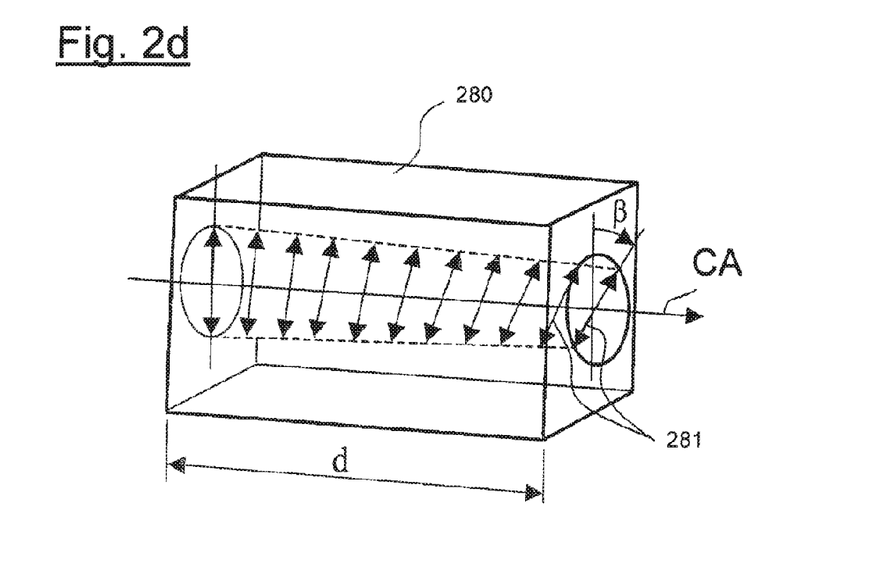
FIG. 2d shows a perspective view to illustrate the mode of operation in principle of an optically active, polarization-influencing optical element.

The polarization-influencing optical element 200 thus has a thickness profile varying in the direction of the optical crystal axis of the optically active crystal. The general mode of operation of optically active crystals and polarization-influencing optical elements made from such crystals is illustrated in FIG. 2d.

Optically active crystals have at least one optical crystal axis CA which is given by the crystal structure. When linearly polarized light is propagated along that optical crystal axis CA the plane of vibration of the electric field vector 281 is rotated through an angle of rotation β proportional to the distance d covered in the crystal 280. The corresponding proportionality factor is the specific rotational capability α and represents a material-specific parameter dependent on the wavelength which is radiated in. The specific rotational capability was determined for example for quartz at a wavelength of 180 nm as (325.2±0.5)°/mm. In particular light which is propagated along the optical crystal axis CA in the crystal 280 does not experience any linear birefringence. The polarization state of linearly polarized light is thus unchanged when passing through an optically active crystal 280 along the optical crystal axis CA, but only has an altered spatial orientation of the plane of vibration of the electric field vector 281, which depends on the length of the distance d covered in the crystal 280.

Figure 3A:
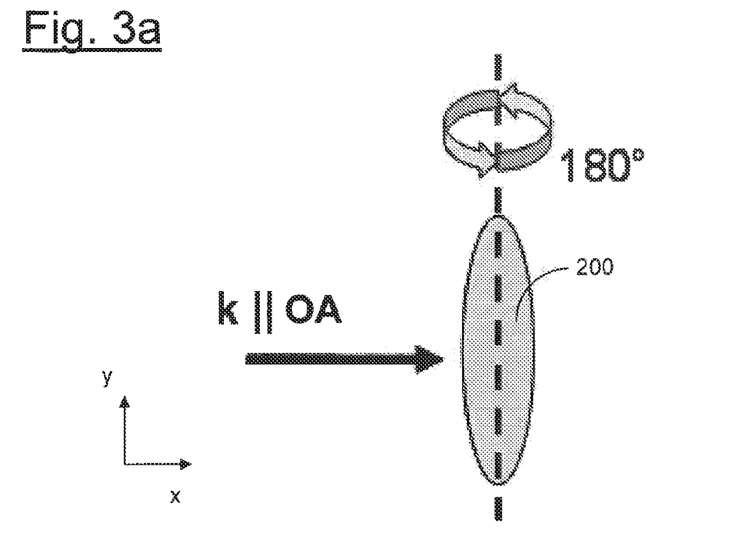
FIGS. 3a-b show diagrammatic views of embodiments of a position manipulator present in the polarization-influencing optical arrangement of FIG. 1, FIGS. 4-6 show diagrammatic views to illustrate the production of different starting polarization distributions using the polarization-influencing optical arrangement of FIG. 1, and FIGS. 7a-b show a perspective view (FIG. 7a) and a thickness profile (FIG. 7b) of an embodiment of a polarization-influencing optical element.
Figure 3B:
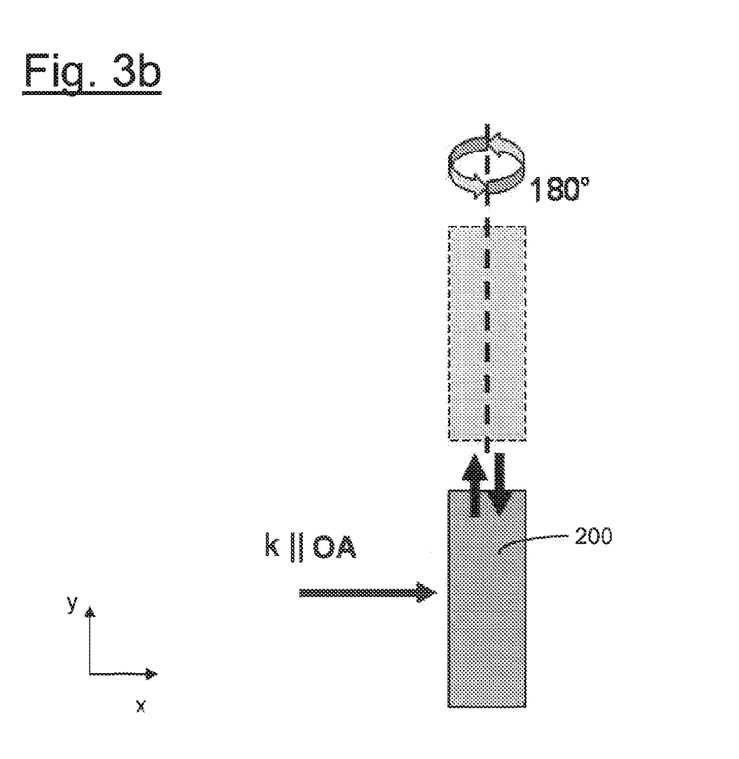

The position manipulation or rotation of the polarization-influencing optical element 200, implemented in accordance with the disclosure, is described hereinafter with reference to FIG. 3. In this case the x-direction is assumed in the illustrated co-ordinate system as being the direction of the optical system axis OA of the illumination system (that is to say the light propagation direction), wherein the polarization-influencing optical element 200 is arranged in the starting position in the y-z-plane.

Figure 4:
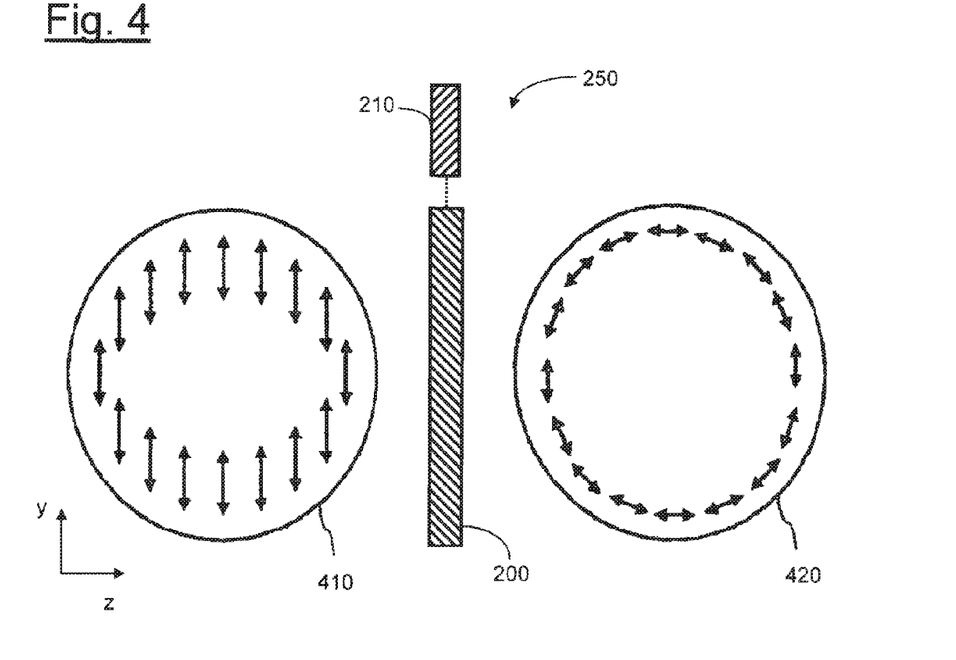

In that case the polarization-influencing optical element 200, as indicated in FIG. 4, produces a tangential starting polarization distribution 420 from a constantly linear input polarization distribution 420 with a preferred polarization direction extending in the y-direction.

Figure 5:
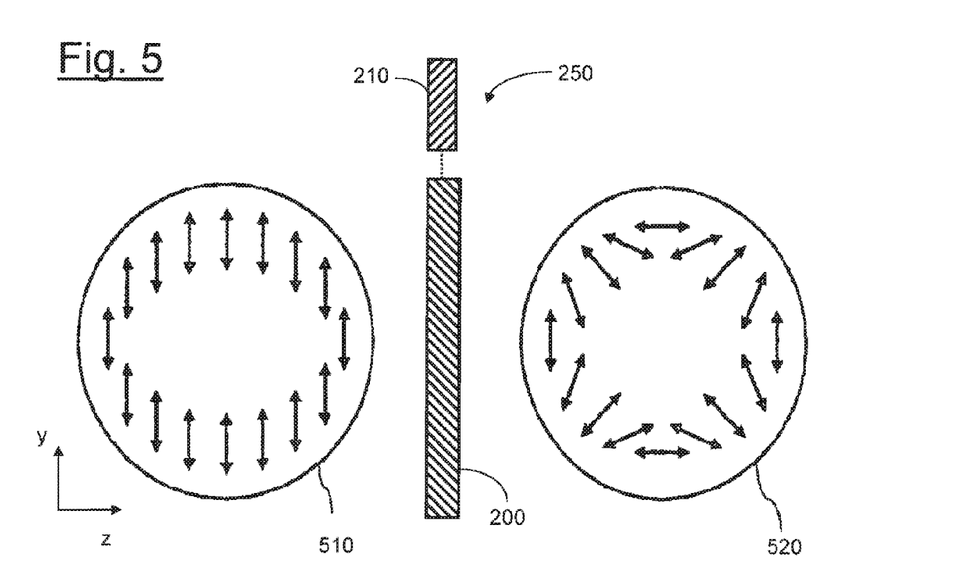

FIG. 5 now indicates the starting polarization distribution 520 produced by the polarization-influencing optical element, for the same constantly linear input polarization distribution 510, for the situation where the polarization-influencing optical element 200 is rotated from the above-described starting position through 180° about an axis perpendicular to the optical system axis OA (that is to say the x-axis). That rotation can alternatively be effected about the y-axis or also about the z-axis and in each case leads to the same starting polarization distribution 520.

As shown in FIG. 5, in that starting polarization distribution 520 the preferred polarization direction or the direction of vibration of the electric field strength vector extends tangentially in the positions at '12 o'clock', '3 o'clock', '6 o'clock' and '9 o'clock', and radially at the positions rotated with respect to those positions through 45° about the x-axis or the optical system axis OA. In between there is a continuous transition between those 'extremes', insofar as the vibration direction goes continuously over the pupil from the tangential into the radial orientation. That polarization distribution thus has a continuous transition between a tangential polarization distribution and a radial polarization distribution and thus represents a 'mixed tangential-radial polarization distribution'. The polarization distribution 520 shown in FIG. 5 can also be referred to as the TE/TM polarization distribution or as the TM/TE polarization distribution.

The transition from the production of the constantly linear input polarization distribution 410 to production of the above-described mixed tangential-radial polarization distribution 520, which is involved with the above-indicated rotation of the polarization-influencing optical element 200, can be explained as follows:

When the polarization-influencing optical element 200 is rotated from its starting position described with reference to FIG. 4, in which it produces the starting polarization distribution 420 from the input polarization distribution 410, through an angle of 180° about the y-axis (see FIG. 3a), then for light which passes through the regions of the element 200 that are on the y-axis (that is to say at '12 o'clock' and '6 o'clock'), the rotational action achieved as a consequence of the optical activity in respect of the direction of vibration of the field strength vector in the end position remains unchanged in relation to the starting position (that is to say the setting prior to the 180° rotation) as the regions on the axis of rotation remain stationary upon rotation about the y-axis.

In addition the rotary action, achieved as a result of the optical activity, in respect of the direction of vibration of the field strength vector, as a consequence of the optical activity, also remains unchanged for light which passes through the regions of the element 280 that are on the z-axis, as the regions of the element 200, that are in mutually opposite relationship along that axis (that is to say at '3 o'clock' and '9 o'clock' respectively) are of the same thickness and, for the rotation of the preferred polarization direction, that is achieved as a consequence of the optical activity, it is immaterial whether the optical element is transmitted in the opposite direction (that is to say 'from front to back' or 'from back to front').

In contrast the other regions of the polarization-influencing optical element 200, which are not on the z-axis or the y-axis and through which light passes, are of different thicknesses prior to and after the above-mentioned rotation of the element 200 as a consequence of the rise or fall in thickness of the segments 210, 220. Consequently after the above-mentioned rotation of the element 200, an element portion of relatively great thickness is disposed at a position at which there was an element portion of relatively small thickness prior to the rotation, and vice-versa. Thus, in comparison with the situation prior to rotation (with respect to the previously produced tangential starting polarization distribution) the direction of the electric field strength vector is rotated either 'too much' or 'too little', which as the outcome leads to the mixed tangential-radial polarization distribution in FIG. 5.

By virtue of the rotatable configuration the polarization-influencing optical element 200 can be flexibly rotated as desired out of the position shown in FIG. 4 (to produce the tangential starting polarization distribution 420) into the position of FIG. 5 (to produce the mixed tangential-radial polarization distribution 520) and vice-versa without the introduction of additional optical components into the beam path being required for that purpose.

To implement the desired rotation of the polarization-influencing optical element 200 the illumination system 110, as diagrammatically indicated in FIG. 1, has a position manipulator 250 which in particular is capable of causing the above-described rotation of the element 200 (see FIG. 3a) and for that purpose is provided with a suitable rotary mechanism and possibly an integrated motor. For that purpose the element 200 can be temporarily drawn out of the beam path (see FIG. 3a), for which purpose the position manipulator 250 can have a suitable actuator ('retractor') for displacement of the polarization-influencing optical element 200 together with its holder out of the optical beam path.

The disclosure is not limited in respect of the polarization-influencing optical element to the thickness profile which is shown in FIG. 2a and which varies in the subelements continuously with the azimuth angle. In accordance with a further embodiment of which a plan view is shown in FIG. 2c the segments of the polarization-influencing optical element 230 can also be of a stepped profile or can be composed of individual respectively plane-parallel elements 231 in the shape of sectors of a circle.

The polarization-influencing optical arrangement comprising the polarization-influencing optical element 200 and the position manipulator 250 in FIG. 1 can also be used for flexible setting of further polarization distributions, as is described hereinafter with reference to the example in FIG. 6.

Figure 6:
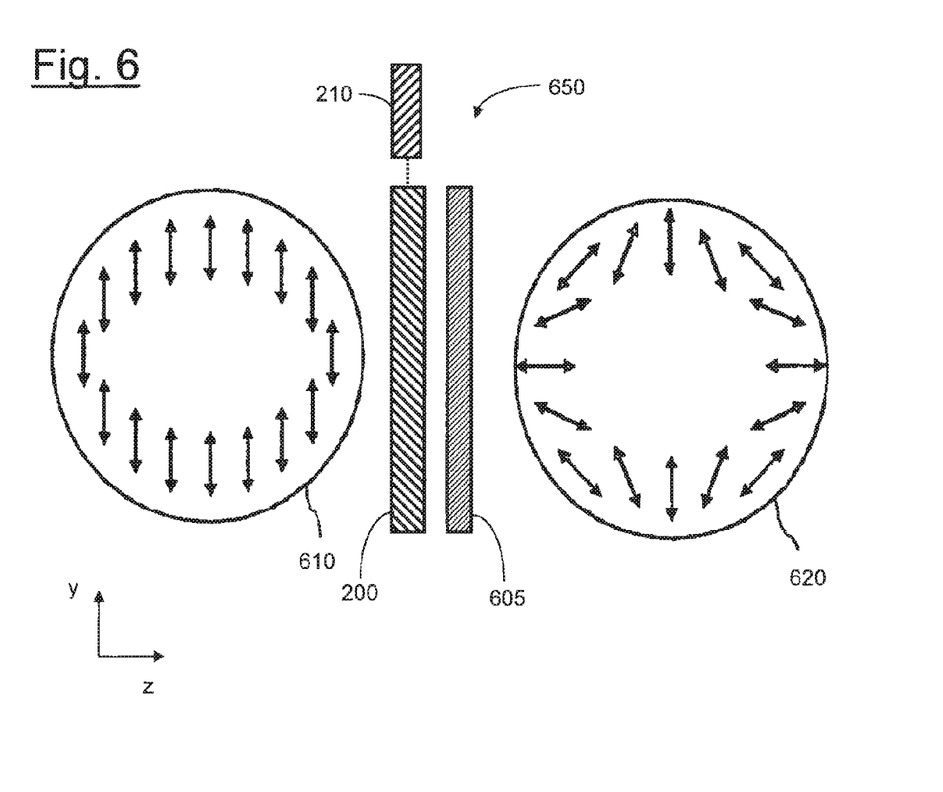

As shown in FIG. 6, arranged in the beam path in addition to the polarization-influencing optical element 200 is a 90° rotator 605, which has the result that, instead of the mixed tangential-radial polarization distribution 520 in FIG. 5, a starting polarization distribution 620 is produced, in which the preferred polarization direction or the direction of vibration of the electric field strength vector is radial in the positions at '12 o'clock', '3 o'clock', '6 o'clock' and '9 o'clock', and is tangential at the positions which are rotated with respect to those positions through 45° about the x-axis or about the optical system axis OA. That starting polarization distribution 620 also has a continuous transition between a tangential polarization distribution and a radial polarization distribution and also represents a mixed tangential-radial polarization distribution.

As shown in FIG. 6 the 90° rotator 605 is arranged downstream in the light propagation direction in relation to the polarization-influencing optical element 200 and provides that the plane of vibration of the electric field strength vector of each individual linearly polarized light ray of the beam is rotated through 90°.

In some embodiments, (not shown) the 90° rotator 605 can also be arranged upstream in the light propagation direction in relation to the polarization-influencing optical element 200.

A possible configuration of the 90° rotator 605 involves the provision of a plane-parallel plate comprising an optically active crystal in the beam path, the thickness of which is about 90°/αp, wherein αp specifies the specific rotational capability of the optically active crystal. As in the case of the polarization-influencing optical element 200 the optical crystal axis of that plane-parallel plate also extends parallel to its element axis. In a further embodiment the 90° rotator can be composed of two λ/2 plates (half wave plates) of birefringent crystal. They each have a slow axis extending in the direction of a small refractive index and a fast axis which is perpendicular thereto and which extends in the direction of a high refractive index. In that case the two λ/2 plates are so rotated relative to each other that in each case their slow axes and their fast axes form an angle of 45°.

A further embodiment for producing the above-described mixed tangential-radial starting polarization distribution is described with reference to FIGS. 7a-b. For that purpose a polarization-influencing optical element 700 is used, which in accordance with the illustrated embodiment is composed of four subelements 710-740 which are also each made from crystalline quartz, have a geometry in the shape of a circular segment and are arranged concentrically relative to the element axis EA. FIG. 7b shows the corresponding thickness profile. In this case once again in each of the four subelements 710-740, the respective optical crystal axis CA is parallel to the element axis EA and each of the four subelements 710-740 is of a thickness profile which as shown in FIG. 7b is dependent only on the azimuth angle θ in relation to a reference axis RA, the reference axis RA intersecting the element axis EA in perpendicular relationship. The thickness of each of the subelements 710-740 therefore again remains constant in the radial direction.

Figure 7A:
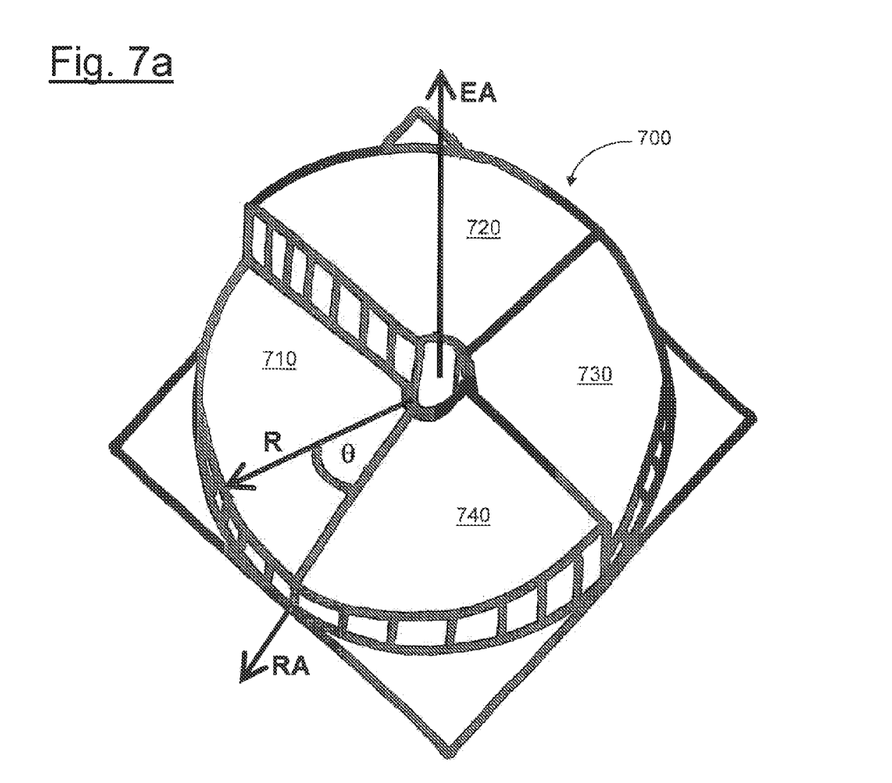
Figure 7B:
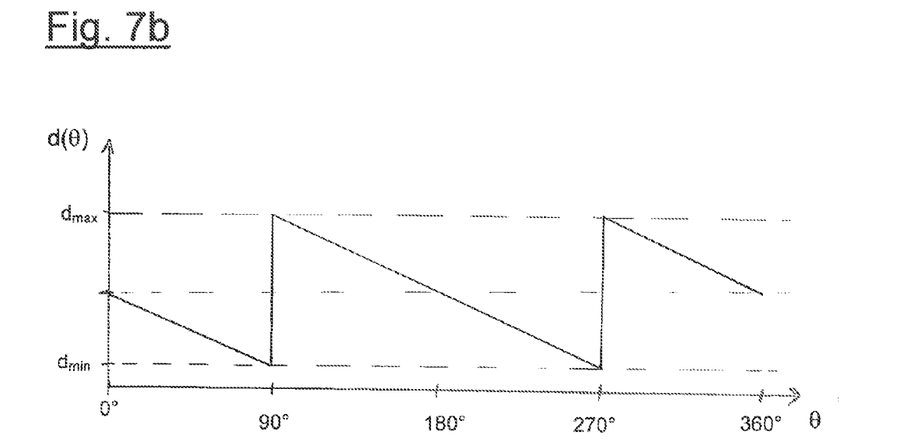

In the FIG. 7 arrangement each of the subelements 710-740 is arranged rotated with respect to the height profile of FIGS. 2a, b through 180° about the respective radial axis of symmetry, in which case the above-described mixed tangential-radial starting polarization distribution is also produced from a linear input polarization distribution with a constant preferred polarization direction.

As shown in FIG. 7b an azimuthal section d (r=const, θ) through the thickness profile d (r, θ) for an azimuth angle 10°<θ<80° (in particular 0°<θ<90°), for an azimuth angle 100°<θ<260° (in particular 90°<θ<270°) and for an azimuth angle 280°<θ<350° (in particular 270°<θ<360°) and in each case for a constant spacing r from the element axis, is a linear function of the azimuth angle θ, wherein said linear function has at least approximately a gradient $$m = -\frac{180°}{\alpha \pi r}$$

wherein α is the specific rotational capability of the optically active crystal. In addition the azimuthal section d (r=const, θ) for the azimuth angle θ=90° and θ=270° respectively involves an approximately abrupt rise through $$\frac{180°}{\alpha}.$$

In some embodiments (not shown), the polarization-influencing optical element 200 shown in FIG. 2 can also be made from levorotatory (instead of dextrorotatory) quartz, in which case the above-described mixed tangential-radial starting polarization distribution is also produced from a linear input polarization distribution.

While certain embodiments are described, variations and alternative embodiments will be apparent to the person skilled in the art, for example by the combination and/or exchange of features of individual embodiments. Accordingly the person skilled in the art will appreciate that other embodiments are in the claims.

The invention claimed is:

1. An optical system comprising an optical system axis and a polarization-influencing optical arrangement, wherein said polarization-influencing optical arrangement comprises:
   at least one polarization-influencing optical element which comprises an optically active material having an optical crystal axis and is of a thickness profile which varies in the direction of said optical crystal axis; and
   a position manipulator for manipulation of the position of said polarization-influencing optical element, wherein the polarization manipulator is adapted to cause rotation of the polarization-influencing optical element about an axis of rotation, wherein said axis of rotation is arranged at an angle of 90°±5° relative to the optical system axis.

2. The optical system of claim 1 wherein the polarization-influencing optical element is adapted in at least one position of the polarization-influencing optical element to convert a linear polarization distribution with a preferred polarization direction that is constant over the light beam cross-section of a light beam passing through the polarization-influencing optical element into an at least approximately tangential polarization distribution.

3. The optical system of claim 1 wherein the optically active material is crystalline quartz.

4. The optical system of claim 1 wherein the polarization-influencing optical element has an element axis and the thickness profile is dependent only on the azimuth angle, wherein the azimuth angle is related to a reference axis which is perpendicular to the element axis and intersects the element axis.

5. The optical system of claim 4 wherein the polarization-influencing optical element is composed of at least two subelements which each have a thickness profile dependent only on the azimuth angle.

6. The optical system of claim 4 wherein an azimuthal section through the thickness profile for an azimuth angle 10°<θ<170° and for an azimuth angle 190°<θ<350° and for a constant spacing r from the element axis, is a linear function of the azimuth angle θ, wherein said linear function has at least approximately a gradient $$|m| = \frac{180°}{\alpha \pi r},$$

wherein α is the specific rotational capability of the optically active crystal.

7. The optical system of claim 6 wherein the azimuthal section for the azimuth angles θ=0° and θ=180° each have an approximately abrupt rise by $$\frac{180°}{\alpha}.$$

8. The optical system of claim 4 wherein the polarization-influencing optical element is composed of four subelements which each have a thickness profile dependent only on the azimuth angle.

9. The optical system of claim 4 wherein an azimuthal section through the thickness profile for an azimuth angle 10°<θ<80°, for an azimuth angle 100°<θ<260° and for an azimuth angle 280°<θ<350° and for a constant spacing r from the element axis, is a linear function of the azimuth angle θ, wherein said linear function has at least approximately a gradient $$m = -\frac{180°}{\alpha \pi r},$$

wherein α is the specific rotational capability of the optically active crystal.

10. The optical system of claim 9 wherein the azimuthal section for the azimuth angles θ=90° and θ=270° each have an approximately abrupt rise by $$\frac{180°}{\alpha}.$$

11. The optical system of claim 1 further comprising a 90° rotator.

12. A microlithographic projection exposure apparatus comprising an illumination system and a projection objective, wherein the illumination system and/or the projection objective comprise an optical system as set forth in claim 1.

13. A process for the microlithographic production of microstructured components comprising the following steps:
   providing a substrate to which a layer of a light-sensitive material is at least partially applied;
   providing a mask having structures which are to be imaged;
   providing a microlithographic projection exposure apparatus as set forth in claim 12; and
   projecting at least a part of the mask on to a region of the layer using the projection exposure apparatus.

14. The optical system of claim 1 wherein the optical system is an optical system of a microlithographic projection exposure apparatus.

15. A microlithographic projection exposure process wherein an object plane of a projection objective is illuminated using an illumination system and wherein the object plane is imaged into an image plane of the projection objective using the projection objective;
   wherein at least two different illumination settings are set using the illumination system; and wherein between said illumination settings a polarization-influencing optical element which is made from optically active material with an optical crystal axis and which is of a thickness profile varying in the direction of said optical crystal axis is rotated about an axis of rotation, wherein said axis of rotation is arranged at an angle of $90°\pm5°$ relative to the optical system axis.

* * * * *

UNITED STATES PATENT AND TRADEMARK OFFICE
CERTIFICATE OF CORRECTION

PATENT NO. : 8,098,366 B2  Page 1 of 1
APPLICATION NO. : 12/968781
DATED : January 17, 2012
INVENTOR(S) : Ingo Saenger It is certified that error appears in the above-identified patent and that said Letters Patent is hereby corrected as shown below:

Column 4,
Line 49, delete "axikon" and insert --axicon--

Signed and Sealed this
Third Day of April, 2012

David J. Kappos
*Director of the United States Patent and Trademark Office*